United States Patent
Morad et al.

(10) Patent No.: US 11,804,565 B2
(45) Date of Patent: Oct. 31, 2023

(54) SOLAR PANEL

(71) Applicant: MAXEON SOLAR PTE. LTD., Singapore (SG)

(72) Inventors: Ratson Morad, Palo Alto, CA (US); Gilad Almogy, Palo Alto, CA (US); Tamir Lance, Los Gatos, CA (US); Nathan Beckett, Oakland, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 0 days.

(21) Appl. No.: 17/707,326

(22) Filed: Mar. 29, 2022

(65) Prior Publication Data

US 2022/0223753 A1    Jul. 14, 2022

Related U.S. Application Data

(63) Continuation of application No. 16/111,578, filed on Aug. 24, 2018, now abandoned, which is a
(Continued)

(51) Int. Cl.
*H01L 31/05* (2014.01)
*H02S 40/34* (2014.01)
(Continued)

(52) U.S. Cl.
CPC ........ *H01L 31/0504* (2013.01); *H01L 31/044* (2014.12); *H02S 20/25* (2014.12);
(Continued)

(58) Field of Classification Search
CPC ... H01L 31/00; H01L 31/02; H01L 31/02002; H01L 31/0208; H01L 31/02021;
(Continued)

(56) References Cited

U.S. PATENT DOCUMENTS 2,938,938 A     5/1960   Dickson, Jr.
3,116,171 A    12/1963   Nielsen et al.
(Continued)

FOREIGN PATENT DOCUMENTS

CN     1769987 A      5/2006
CN   100999320 A      7/2007
(Continued)

OTHER PUBLICATIONS

Goldberg, Lee H., "Active Bypass Diodes Improve Solar Panel Efficiency and Performance", Digi-Key Corporation, http://www.digikey.com/en/articles/techzone/2012/dec/activebypassdiodesimprovesolarpanelefficiencyandperformance, Dec. 12, 2012, 8 pages.
(Continued)

*Primary Examiner* — Christina Chern
(74) *Attorney, Agent, or Firm* — Schmidt Patent Law, Inc

(57) ABSTRACT

A high efficiency configuration for a solar cell module comprises solar cells arranged in an overlapping shingled manner and conductively bonded to each other in their overlapping regions to form super cells, which may be arranged to efficiently use the area of the solar module. Rear surface electrical connections between solar cells in electrically parallel super cells provide alternative current paths (i.e., detours) through the solar module around damaged, shaded, or otherwise underperforming solar cells.

18 Claims, 14 Drawing Sheets

Related U.S. Application Data continuation of application No. 15/210,516, filed on Jul. 14, 2016, now Pat. No. 10,084,104.

(60) Provisional application No. 62/206,667, filed on Aug. 18, 2015.

(51) Int. Cl.
  *H02S 20/25* (2014.01)
  *H02S 40/36* (2014.01)
  *H01L 31/044* (2014.01)

(52) U.S. Cl.
  CPC .............. *H02S 40/34* (2014.12); *H02S 40/36* (2014.12); *Y02B 10/10* (2013.01); *Y02E 10/50* (2013.01)

(58) Field of Classification Search
  CPC ... H01L 31/0224; H01L 31/04; H01L 31/042; H01L 31/044; H01L 31/046; H01L 31/0465; H01L 31/0475; H01L 31/05; H01L 31/0516
  See application file for complete search history.

(56) References Cited

U.S. PATENT DOCUMENTS

| | | | |
|---|---|---|---|
| 3,340,096 A | 9/1967 | Mann et al. |
| 3,459,597 A | 8/1969 | Baron |
| 3,769,091 A | 10/1973 | Leinkram et al. |
| 3,811,181 A | 5/1974 | Leinkram et al. |
| 3,837,924 A | 9/1974 | Baron |
| 4,257,821 A | 3/1981 | Kelly et al. |
| 4,617,420 A | 10/1986 | Dilts et al. |
| 4,617,421 A | 10/1986 | Nath et al. |
| 4,652,693 A | 3/1987 | Bar-On |
| 4,877,460 A | 10/1989 | Flodl |
| 5,590,495 A | 1/1997 | Bressler et al. |
| 5,616,185 A | 4/1997 | Kukulka |
| 6,034,322 A | 3/2000 | Pollard |
| 6,218,605 B1 | 4/2001 | Dally et al. |
| 6,232,545 B1 | 5/2001 | Samaras et al. |
| 6,262,358 B1 | 7/2001 | Kamimura et al. |
| 6,303,853 B1 | 10/2001 | Fraas et al. |
| 6,315,575 B1 | 11/2001 | Kajimoto |
| 6,353,175 B1 | 3/2002 | Fraas |
| 6,414,235 B1 | 7/2002 | Luch |
| 6,441,297 B1 | 8/2002 | Keller et al. |
| 6,489,553 B1 | 12/2002 | Fraas et al. |
| 6,525,262 B1 | 2/2003 | Makita et al. |
| 6,538,193 B1 | 3/2003 | Fraas |
| 6,563,289 B1 | 5/2003 | Cross |
| 6,573,445 B1 | 6/2003 | Burgers |
| 6,610,919 B2 | 8/2003 | Ohkubo |
| 6,653,550 B2 | 11/2003 | Hayashi et al. |
| 6,670,787 B2 | 12/2003 | Tachibana |
| 6,770,544 B2 | 8/2004 | Sawada |
| 6,803,513 B2 | 10/2004 | Beernink et al. |
| 7,238,878 B2 | 7/2007 | Gonsiorawski |
| 7,271,333 B2 | 9/2007 | Fabick et al. |
| 7,388,146 B2 | 6/2008 | Fraas et al. |
| 7,390,961 B2 | 6/2008 | Aschenbrenner et al. |
| 7,507,903 B2 | 3/2009 | Luch |
| 7,534,699 B2 | 5/2009 | Wong et al. |
| 7,635,810 B2 | 12/2009 | Luch |
| 7,772,484 B2 | 8/2010 | Li et al. |
| 7,777,128 B2 | 8/2010 | Montello et al. |
| 7,781,672 B2 | 8/2010 | Gaudiana et al. |
| 7,825,329 B2 | 11/2010 | Basol |
| 7,829,781 B2 | 11/2010 | Montello et al. |
| 7,829,785 B2 | 11/2010 | Basol |
| 7,851,700 B2 | 12/2010 | Luch |
| 7,868,249 B2 | 1/2011 | Luch |
| 7,872,192 B1 | 1/2011 | Fraas et al. |
| 7,989,692 B2 | 8/2011 | Luch |
| 7,989,693 B2 | 8/2011 | Luch |
| 8,110,737 B2 | 2/2012 | Luch |
| 8,138,413 B2 | 3/2012 | Luch et al. |
| 8,207,440 B2 | 6/2012 | Basol |
| 8,222,513 B2 | 6/2012 | Luch |
| 8,304,646 B2 | 11/2012 | Luch |
| 8,319,097 B2 | 11/2012 | Luch |
| 8,334,451 B2 | 12/2012 | Polce et al. |
| 8,378,209 B2 | 2/2013 | Masson et al. |
| 8,574,943 B2 | 11/2013 | Murray et al. |
| 8,586,857 B2 | 11/2013 | Everson et al. |
| 8,586,875 B2 | 11/2013 | Morita et al. |
| 8,729,385 B2 | 5/2014 | Luch |
| 8,766,090 B2 | 7/2014 | Sewell et al. |
| 2003/0029494 A1 | 2/2003 | Ohkubo |
| 2003/0121228 A1 | 7/2003 | Stoehr et al. |
| 2004/0261836 A1 | 12/2004 | Kataoka et al. |
| 2005/0217717 A1 | 10/2005 | Faris |
| 2005/0268959 A1 | 12/2005 | Aschenbrenner et al. |
| 2007/0181175 A1 | 8/2007 | Landis |
| 2007/0283996 A1 | 12/2007 | Hachtmann et al. |
| 2007/0283997 A1 | 12/2007 | Hachtmann et al. |
| 2008/0156365 A1 | 7/2008 | Scholz et al. |
| 2008/0216887 A1 | 9/2008 | Hacke et al. |
| 2009/0000221 A1 | 1/2009 | Jacobs et al. |
| 2009/0038671 A1 | 2/2009 | Yamaguchi |
| 2009/0114279 A1 | 5/2009 | Zhao et al. |
| 2009/0184746 A1 | 7/2009 | Fahrenbruch |
| 2009/0229596 A1 | 9/2009 | Shin et al. |
| 2010/0012172 A1 | 1/2010 | Meakin et al. |
| 2010/0043863 A1 | 2/2010 | Wudu et al. |
| 2010/0071752 A1 | 3/2010 | Vellore et al. |
| 2010/0078057 A1 | 4/2010 | Karg et al. |
| 2010/0078064 A1 | 4/2010 | Coakley |
| 2010/0084004 A1 | 4/2010 | Ortabasi |
| 2010/0131108 A1 | 5/2010 | Meyer |
| 2010/0136748 A1 | 6/2010 | Autry |
| 2010/0147364 A1 | 6/2010 | Gonzalez et al. |
| 2010/0218799 A1 | 9/2010 | Stefani |
| 2010/0224230 A1 | 9/2010 | Luch et al. |
| 2010/0243024 A1 | 9/2010 | Hashimoto et al. |
| 2010/0308662 A1 | 12/2010 | Schatz et al. |
| 2011/0005572 A1 | 1/2011 | Shimizu |
| 2011/0048501 A1 | 3/2011 | Jaus et al. |
| 2011/0067751 A1 | 3/2011 | Meakin et al. |
| 2011/0083726 A1 | 4/2011 | Takayanagi et al. |
| 2011/0114158 A1 | 5/2011 | Lenox |
| 2011/0114165 A1 | 5/2011 | Chang |
| 2011/0155209 A1 | 6/2011 | Tober et al. |
| 2011/0168237 A1 | 7/2011 | Takeda et al. |
| 2011/0168238 A1 | 7/2011 | Metin et al. |
| 2011/0192448 A1 | 8/2011 | Croft et al. |
| 2011/0197947 A1 | 8/2011 | Croft |
| 2011/0214714 A1 | 9/2011 | Aberle et al. |
| 2011/0240337 A1 | 10/2011 | Montello et al. |
| 2011/0271999 A1 | 11/2011 | Almogy et al. |
| 2011/0315184 A1 | 12/2011 | Kabade |
| 2012/0031457 A1 | 2/2012 | Taira et al. |
| 2012/0037206 A1 | 2/2012 | Norman et al. |
| 2012/0048349 A1 | 3/2012 | Metin et al. |
| 2012/0118355 A1 | 5/2012 | Rudolfs |
| 2012/0125391 A1 | 5/2012 | Pinarbasi et al. |
| 2012/0152327 A1 | 6/2012 | Pinarbasi et al. |
| 2012/0152349 A1 | 6/2012 | Cao et al. |
| 2012/0234388 A1 | 9/2012 | Stancel et al. |
| 2012/0244656 A1 | 9/2012 | Kim et al. |
| 2012/0268087 A1 | 10/2012 | Kernahan |
| 2012/0279548 A1 | 11/2012 | Munch et al. |
| 2012/0318318 A1 | 12/2012 | Metin et al. |
| 2012/0318319 A1 | 12/2012 | Pinarbasi et al. |
| 2012/0325282 A1 | 12/2012 | Snow et al. |
| 2013/0068279 A1 | 3/2013 | Buller et al. |
| 2013/0096710 A1 | 4/2013 | Pinarbasi et al. |
| 2013/0152996 A1 | 6/2013 | DeGroot et al. |
| 2013/0160823 A1 | 6/2013 | Khouri et al. |
| 2013/0160824 A1 | 6/2013 | Khouri et al. |
| 2013/0206203 A1 | 8/2013 | Lommasson et al. |
| 2013/0206210 A1 | 8/2013 | Niinobe et al. |
| 2013/0206213 A1 | 8/2013 | He et al. |

(56) References Cited

U.S. PATENT DOCUMENTS

| | | |
|---|---|---|
| 2013/0206221 A1 | 8/2013 | Gannon et al. |
| 2014/0060610 A1 | 3/2014 | Moslehi et al. |
| 2014/0116495 A1 | 5/2014 | Kim et al. |
| 2014/0124013 A1 | 5/2014 | Morad et al. |
| 2014/0318613 A1 | 10/2014 | Von Campe et al. |
| 2015/0349175 A1 | 12/2015 | Morad et al. |
| 2015/0349703 A1 | 12/2015 | Morad et al. |
| 2016/0158890 A1 | 6/2016 | Gonzalez et al. |
| 2016/0163888 A1 | 6/2016 | Reddy |
| 2016/0163903 A1 | 6/2016 | Yang et al. |
| 2016/0163907 A1 | 6/2016 | Gonzalez et al. |
| 2016/0163908 A1 | 6/2016 | Gonzalez et al. |
| 2016/0163909 A1 | 6/2016 | Gonzalez et al. |
| 2016/0163912 A1 | 6/2016 | Gonzalez et al. |
| 2016/0163913 A1 | 6/2016 | Gonzalez |
| 2016/0163914 A1 | 6/2016 | Gonzalez et al. |

FOREIGN PATENT DOCUMENTS

| | | |
|---|---|---|
| CN | 101510570 A | 8/2009 |
| CN | 102730957 A | 10/2012 |
| CN | 102856425 A | 1/2013 |
| CN | 102971865 A | 3/2013 |
| DE | 4017933 A1 | 12/1991 |
| DE | 1030713 A1 | 4/1992 |
| DE | 102009026027 A1 | 1/2011 |
| EM | 002032581-0005 | 4/2012 |
| EP | 2284908 A1 | 2/2011 |
| EP | 2362430 A1 | 8/2011 |
| ES | 2146182 A1 | 7/2000 |
| FR | 910321-001 | 1/1991 |
| JP | 07-022357 A | 1/1995 |
| JP | 11-350685 A | 12/1999 |
| JP | 2002277448 A | 9/2002 |
| JP | 2006-525137 A | 11/2006 |
| JP | 2006344910 A | 12/2006 |
| JP | 2014017447 A | 1/2014 |
| TW | 201120973 A | 6/2011 |
| WO | 2009047815 A1 | 4/2009 |
| WO | 2010095583 A1 | 8/2010 |
| WO | 2012033657 A2 | 3/2012 |
| WO | 2012099705 A2 | 7/2012 |
| WO | 2013020590 A1 | 2/2013 |
| WO | 2012043770 A1 | 2/2014 |
| WO | 2014074826 A2 | 5/2014 |
| WO | 2014098771 A1 | 6/2014 |
| WO | 2014192272 A1 | 12/2014 |
| WO | 2015001413 A1 | 1/2015 |

OTHER PUBLICATIONS

Herrmann, W. et al., "Operational Behaviour of Commercial Solar Cells Under Reverse Biased Conditins", TÜV Rheinland Sicherheit und Umweltschutz GmbH, 3 pages.

Creative Materials, "Product Announcement: Flexible Electrically Conductive Adhesive Family as Solder Replacements in Solar Cells", http://www.creativematerials.com/news/pr-conductive-adhesive-for-solar-cells.php, Feb. 9, 2015, 2 pages.

Creative Materials, "124-08 A/B Electrically Conductive Epoxy Adhesive", www.creativematerials.com, Apr. 22, 2010, Revision: E, 1 page.

Herrmann, W. et al. "Hot Spot Investigations on PV Modules—New Concepts for a Test Standard and Consequences for Module Design with Respect to Bypass Diodes", TÜV Rheinland Sicherheit und Umweltschutz GmbH, 4 pages.

Yang, et al., "Investigation of the Relationship between Reverse Current of Crystalline Silicon Solar Cells and Conduction of Bypass Diode", Hindawi Publishing Corporation International Journal of Photoenergy, vol. 2012, Article ID 357218, 6 pages.

Breitenstein, O. et al., "Shunts due to laser scribing of solar cells evaluated by highly sensitive lock-in thermography", 11th International Photovoltaic Science and Engineering Conference (PVSEC-11), 20-24 Sep. 1999 Sapporo, Japan, 9 pages.

Kyocera, News Releases 2009, "KYOCERA Explains Innovations Used in Solar Panel for New Toyota Prius", http://global.kyocera.com/new/2009/0902/fpri.html, Dec. 21, 2014, 2 pages.

Herrmann, W. et al., "Hot Spot Investigations on PV Modules—New Concepts for a Test Standard and Consequences for Module Design with Respect to Bypass Diodes," TÜV Rheinland Sicherheit und Umweltschutz GmbH, http://ieeexplore.ieee.org, Dec. 20, 2014, 6 pages.

Mäki, et al., "Power Losses in Long String and Parallel-Connected Short Strings of Series-Connected Silicon-Based Photovoltaic Modules Due to Partial Shading Conditions", IEEE Transactions on Energy Conversion, vol. 27, No. 1, Mar. 2012, pp. 173-183.

Halavani, et al., "Results of Pressue-Only Cell Interconnections in High Voltage PV-Modules", 29th European Photovoltaic Solar Energy Conference and Exhibition, Vienna University of Technology, pp. 64-68.

Heimann, M., et al., "Ultrasonic Bonding of Aluminum Ribbons to Interconnect High-Efficiency Crystalline-Silicon Solar Cells", Energy Procedia 27 (2012) pp. 670-675.

Silvestre S., et al., "Study of bypass diodes configuration on PV modules", Applied Energy 86 (2009) pp. 1632-1640.

Scholten, "Silicone Encapsulation of c-Si Photovoltaic Modules", Solar Novus Today, Feb. 10, 2014, 5 pages, http://www.solarnovus.com.

3M™ "Thermally Conductive Heat Spreading Tape, 9876B-05, 9876B-08, 9876-10, 9876-15", Nov. 2012, pp. 1-4.

STMicroelectronics, "How to choose a bypass diode for a silicon panel junction box", Sep. 2011, pp. 1-24.

Kray, D., et al., "Reducing AG Cost and Increasing Efficiency. Multicrystalline Silicon Solar Cells With Direct Plated Contacts Exceeding 17% Efficiency", 26th EU PVSEC Proceedings, pp. 1199-1202.

R.A. Matula, "Electrical Resistivity of Copper, Bold, Palladium, and Silver" J. Phys. Chem. Ref. Data, vol. 8, No. 4, 1979, 152 pages.

EPO-TEK H20 Technical Data Sheet.

U.S. Appl. No. 62/088,509 "System, Method, and Apparatus for Automatic Manufacturing of Solar Panels" filed Dec. 5, 2014, Jiunn Benjamin Heng, et al., 28 pages.

U.S. Appl. No. 62/143,694 "Systems and Methods for Precision Automation ofManufacturing Solar Panels" filed Apr. 6, 2015, Jiunn Menjamin Heng, et al., 101 pages.

Crystalline vs. Thin Film Polar Panels from Solaris posted on Apr. 25, 2017 retrieved from https://www.solaris-shop.com/blog/crystalline-vs-thin-film-solar-panels/.

Office Action corresponding to German application No. 112016003768.6 dated Jul. 22, 2019, Applicant: SunPower Corporation, 4 pages.

SOLAR PANEL

CROSS REFERENCE TO RELATED APPLICATIONS

This application is a continuation of U.S. patent application Ser. No. 16/111,578 filed Aug. 24, 2018, which is a continuation of U.S. patent application Ser. No. 15/210,516 titled "Solar Panel" and filed Jul. 14, 2016, which claims benefit of priority to U.S. Provisional Application No. 62/206,667 titled "Solar Panel" filed Aug. 18, 2015. Each of the foregoing applications is incorporated herein by reference in its entirety.

FIELD OF THE INVENTION

The invention relates generally to solar cell modules in which the solar cells are arranged in a shingled manner, and more particularly to such solar modules in which rear surface electrical connections between solar cells in electrically parallel rows of solar cells provide detour current paths through the solar module around any underperforming solar cells.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

In one aspect, a solar module comprises a plurality of super cells arranged in two or more physically parallel rows with the rows electrically connected to each other in parallel. Each super cell comprises a plurality of rectangular silicon solar cells arranged in line with long sides of adjacent silicon solar cells overlapping and conductively bonded directly to each other to electrically connect the silicon solar cells in series. The solar module also comprises a plurality of detour electrical interconnects each of which is arranged to extend perpendicularly to the rows of super cells to electrically connect rear surfaces of at least one pair of solar cells located side-by-side in adjacent rows to provide detour current paths through the module around one or more other solar cells in the event that the one or more other solar cells provide insufficient current for normal operation of the module. These detour current paths do not pass through bypass diodes.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners.

This specification discloses high-efficiency solar modules (also referred to herein as solar panels) comprising silicon solar cells arranged in an overlapping shingled manner and electrically connected in series by conductive bonds between adjacent overlapping solar cells to form super cells, with the super cells arranged in physically parallel rows in the solar module. A super cell may comprise any suitable number of solar cells. The super cells may have lengths spanning essentially the full length or width of the solar module, for example, or two or more super cells may be arranged end-to-end in a row. This arrangement hides solar cell-to-solar cell electrical interconnections and increases the efficiency and the aesthetic attractiveness of the module.

Advantageously, the solar modules described herein include electrical interconnects between rear surfaces of solar cells in adjacent rows of super cells that provide alternative current paths (i.e., detours) through the solar panel around damaged, shaded, or otherwise underperforming solar cells. These detour current paths do not pass through bypass diodes.

Figure 1:
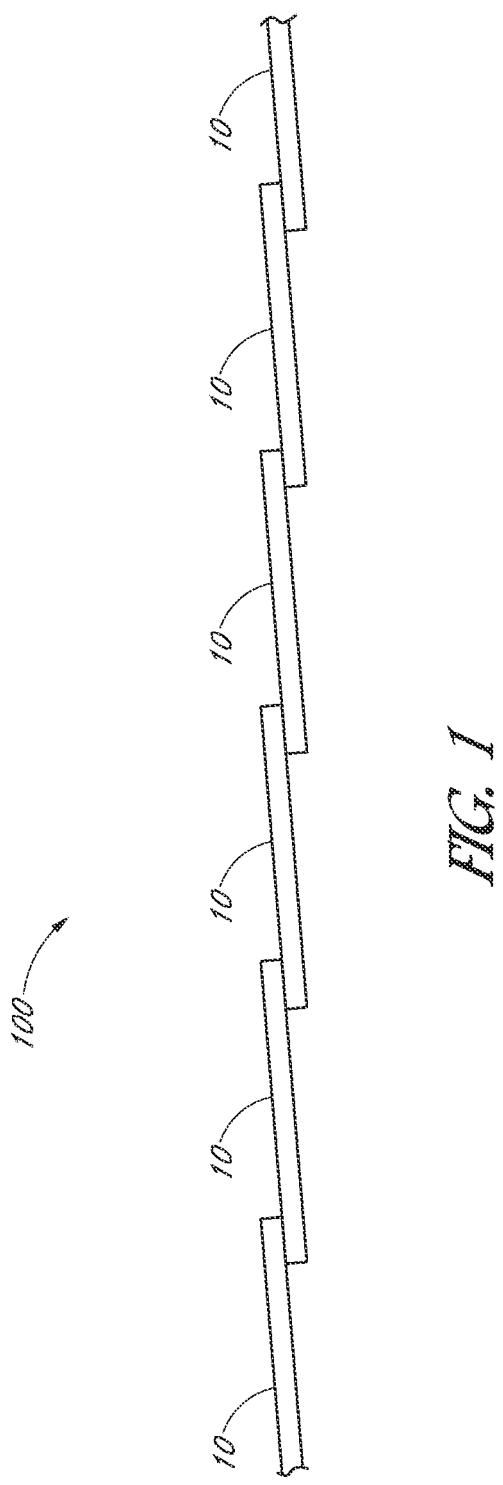
FIG. 1 shows a cross-sectional diagram of a string of series-connected solar cells arranged in a shingled manner with the ends of adjacent solar cells overlapping to form a shingled super cell.

Turning now to the figures for a more detailed understanding of the solar modules described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Rectangular solar cells 10 may be prepared, for example, by separating a standard sized square or pseudo-square solar cell wafer into two or more (i.e., N) rectangular solar cells each having a length equal to the side length (e.g., 156 millimeters) of the standard sized solar cell wafer and a width equal to a fraction (i.e., about 1/N) of the side length of the standard sized solar cell wafer. N may be, for example, 2 to 20 or more, for example 6 or 8.

Referring again to FIG. 1, in super cell 100 adjacent solar cells 10 are conductively bonded directly to each other in the region in which they overlap by an electrically conductive bonding material that electrically connects the front surface metallization pattern of one solar cell to the rear surface metallization pattern of the adjacent solar cell. Suitable electrically conductive bonding materials may include, for example, electrically conductive adhesives and electrically conductive adhesive films and adhesive tapes, and conventional solders.

Figure 2:
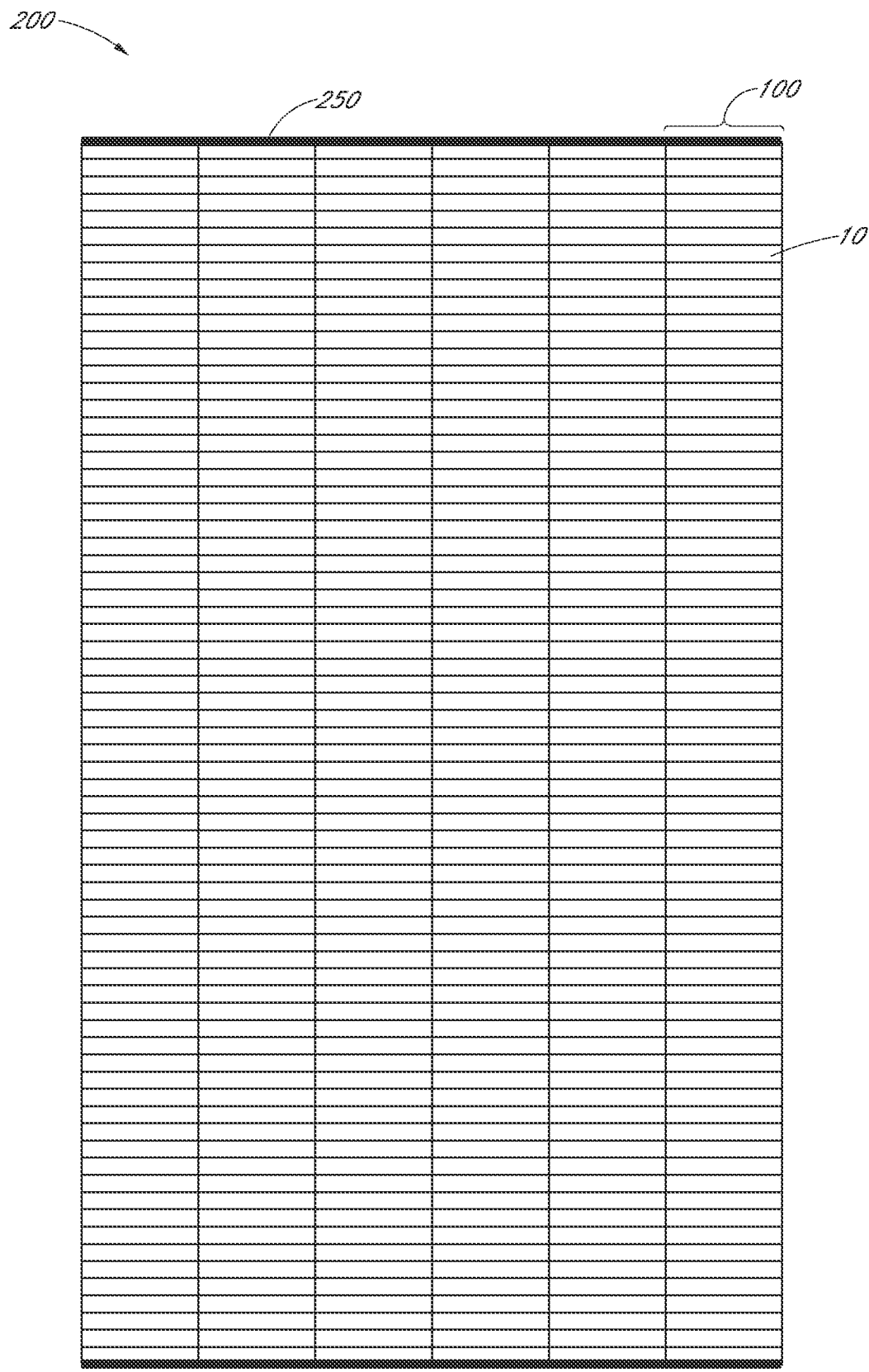
FIG. 2 shows a diagram of the front surface of an example rectangular solar module comprising a plurality of rectangular shingled super cells, with the long side of each super cell having a length of approximately the full length of the long side of the module. The super cells are arranged with their long sides parallel to the long sides of the module.

FIG. 2 shows a front view of an example rectangular solar module 200 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells, which may be electrically interconnected in series for example. The modules may have shorts sides having a length, for example, of about 1 meter and long sides having a length, for example, of about 1.5 to about 2.0 meters. Any other suitable shapes (e.g., square) and dimensions for the solar modules may also be used. A super cell may comprise any suitable number of rectangular solar cells of any suitable dimensions. Similarly, a row of super cells may comprise any suitable number of rectangular solar cells of any suitable dimensions arranged in one or more super cells.

Solar modules as described herein typically comprise many more (e.g., N times) as many solar cells as a conventional module of the same size because N rectangular solar cells are formed from a single conventional sized solar cell wafer. Optionally, the super cells formed from these solar cells may be arranged in an electrically parallel/series combination that provides current and voltage outputs similar to those provided by a solar module of about the same size comprising series-connected conventional size solar cells. For example, if a conventional module includes M conventional size solar cells electrically connected in series, then a corresponding shingled super cell module comprising N electrically parallel rows of super cells with each super cell row comprising M series connected rectangular solar cells (each having 1/N the area of a conventional solar cell) would provide about the same voltage and current output as the conventional module.

The example solar modules of FIG. 2 and of FIGS. 3-11 (described below) comprise six rows of super cells all of which are electrically interconnected in parallel by terminal interconnects 250 at opposite ends of the rows. Because of the electrically parallel arrangement, the voltage across each row (voltage between one end of the row and the other) is the same though the current through each row may be different. "Detour" electrical interconnect arrangements similar to those described below with respect to FIGS. 3-11 may also be employed in solar modules comprising fewer rows of super cells and/or in which some but not all rows of super cells are electrically connected in parallel.

Typically, though not necessarily, the solar modules described herein comprise one or more (e.g., three) bypass diodes. If a solar cell arranged electrically in parallel with one of the bypass diodes significantly limits current due to shading, cracking, or otherwise suboptimal cell performance, the bypass diode will become forward biased and electrically bypass that solar cell or a portion of the module including that solar cell. This prevents formation of a dangerous hot spot around the current limiting cell and improves performance of the module.

Because the solar modules described herein include super cells electrically connected in parallel, there is an opportunity to improve performance further by providing alternate current paths (i.e. detours) so that in the event that one cell in a super cell is severely shaded or otherwise current limiting an adjacent string of cells in an electrically parallel super cell can try to compensate by operating at a higher current. These detour paths pass through the rear surface metallization of solar cells and through detour electrical interconnects that electrically connect equal voltage pairs of solar cells located side-by-side in adjacent super cell rows in the module. Conduction through the rear surface metallization of the solar cells enable the bypass and detour architectures using detour interconnects and/or planar patterned metallized back sheets described herein.

In the extreme case all rows of super cells are electrically connected in parallel and every solar cell would have detour connectors attached to at least one cell in a different (e.g., adjacent) row to provide alternative current paths. However, detour connectors can instead be placed on a subset of cells to statistically reduce the likelihood that damage from cracking or other failure mechanisms significantly degrades performance of the module.

Furthermore, detour connections can be concentrated in areas of the module most likely to experience cell cracking, such as for example along well know stress lines from mechanical loading. Cracks can be created by several mechanisms, may be dependent on the way the module is mounted in the field or on the roof, and may occur in predictable patterns based on the mounting method and the source of stress. Wind and snow load create specific stress and hence cracking. Walking on the module may create cracks. Severe hail may create another type of crack. While initially cracks may not cause electrical disconnects or otherwise degrade a module's performance, the cracks may expand as the module goes though heating and cooling cycles and eventually significantly affect module performance. Cracks in monocrystalline and polycrystalline cells may behave differently.

The detour electrical connections between the rear surface metallization on solar cells in adjacent rows may be made, for example, using short copper interconnects that bridge a gap between the rows and that are conductively bonded at opposite ends to the rear surfaces of the solar cells. The detour interconnects may be bonded to the solar cells (e.g., to contact pads on the rear surface of the solar cells) using solder or conductive glue or other conductive adhesive, for example, or by any other suitable method. Any portion of a detour interconnect that would otherwise be visible from the front of the solar module (i.e., through a gap between rows) may be covered with a black coating or black tape, or otherwise darkened or hidden, to preserve an "all black" look from a front view of the module. In operation, the conductive detour current path may include portions of the rear surface (e.g., aluminum) cell metallization as well as the detour interconnect.

Alternatively, the detour interconnections between solar cells in a "line" of solar cells oriented perpendicularly to the super cell rows may be made for example with a single long approximately module-width crossing ribbon that is conductively bonded to the rear surface of each cell in the line. This approach may be preferred for example for modules including very large numbers of solar cells, for example a module having six rows of super cells with each row having eighty solar cells. Such a module would otherwise require 400 separate short interconnects to provide detour paths for each cell.

The detour interconnections (short or long) may be made in the same way as "hidden tap" interconnections to bypass diodes, as described for example in U.S. patent application Ser. No. 14/674,983 titled "Shingled Solar Cell Panel Employing Hidden Taps" filed Mar. 31, 2015, which is incorporated herein by reference in its entirety. The '983 application also discloses rear surface metallization patterns and contact pads for hidden tap interconnections to bypass diodes that facilitate detour interconnections as described herein as well. As shown in FIGS. 3-11, for example, the detour paths and the connections to bypass diodes in a solar module may be made using the same or substantially similar types of interconnects.

The detour interconnections may also be made, for example, using a patterned metallized back sheet conductively bonded to the rear surfaces of the solar cells, with the patterned metallization on the back sheet providing the detour current interconnections. The patterned metallization on the back sheet may also provide electrical connections to bypass diodes and/or to a junction box. (See discussion of FIGS. 14A-14B below, for example). Typically, the metallization pattern on the back sheet is single layer planar.

Figure 3:
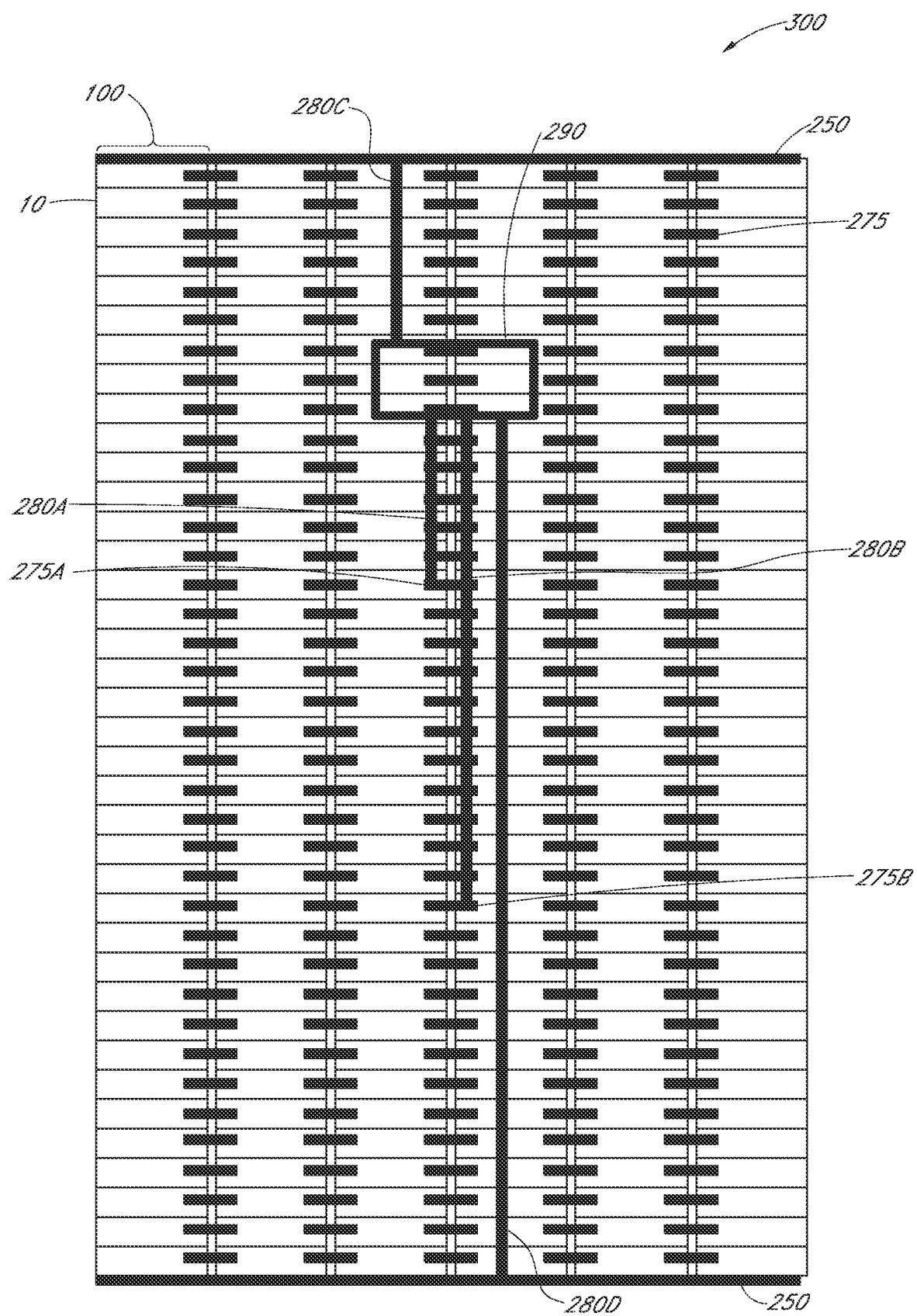
FIGS. 3-11 show diagrams of the rear surfaces of example solar modules in which electrical interconnections between rear surfaces of solar cells in adjacent rows of super cells provide alternative current paths (i.e., detours) through the solar module around damaged, shaded, or otherwise underperforming solar cells.

In the example solar module 300 of FIG. 3, all available detour paths are installed. That is, the rear surface metallization of each solar cell 10 is electrically connected to the rear surface metallization of its neighbor solar cell (or solar cells) in adjacent super cell rows by detour interconnectors 275. Two of the detour interconnections (275A and 275B) are also electrically connected via return wires (conductors) 280A and 280B to three bypass diodes (not shown) in junction box 290. Return wires 280C and 280D electrically connect the bypass diodes to terminal interconnects 250. The other detour interconnections in line across the rows with detour interconnect 275A or 275B serve as hidden taps to the bypass diodes in addition to providing detour current paths. (Similar arrangements with detour interconnects also providing hidden taps to bypass diodes are shown in other figures, as well).

In FIG. 3 and the other figures described below, it should be understood that return wires such as 280A-280D, for example, are electrically insulated from the solar cells and conductors over which they pass, except at their ends. For example, return wire 280B in FIG. 3 is electrically connected (e.g., conductively bonded) to detour electrical interconnect 275B but electrically insulated from the other detour electrical interconnects over which it passes on the way to junction box 290. This may be accomplished for example with a strip of insulation placed between the return wire and the rear surfaces of the solar cells and other module components.

Figure 4:
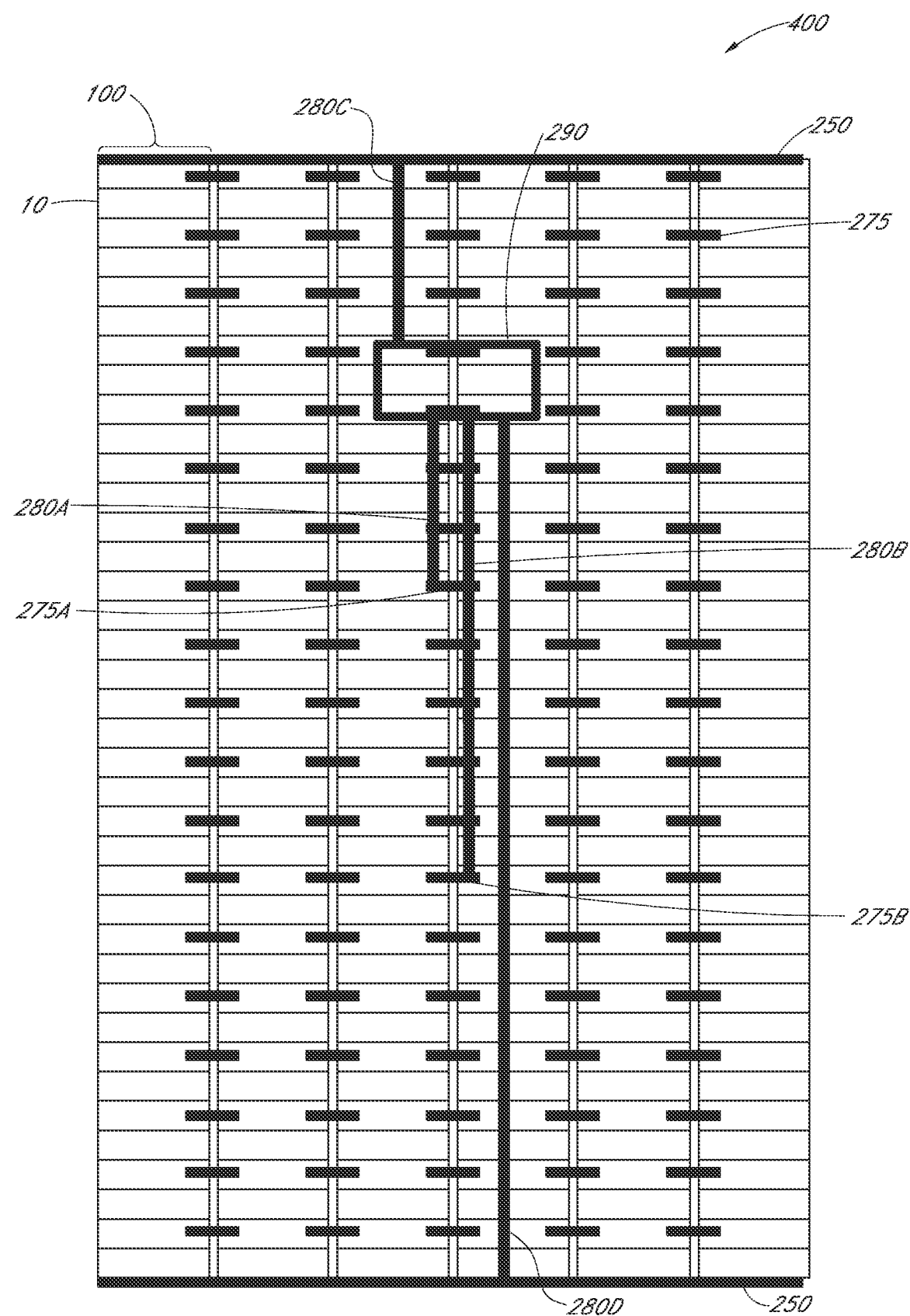

The example solar module 400 of FIG. 4 is similar to that of FIG. 3, except that in solar module 400 every other (i.e., alternating) solar cell along a super cell row has detours installed.

Figure 5:
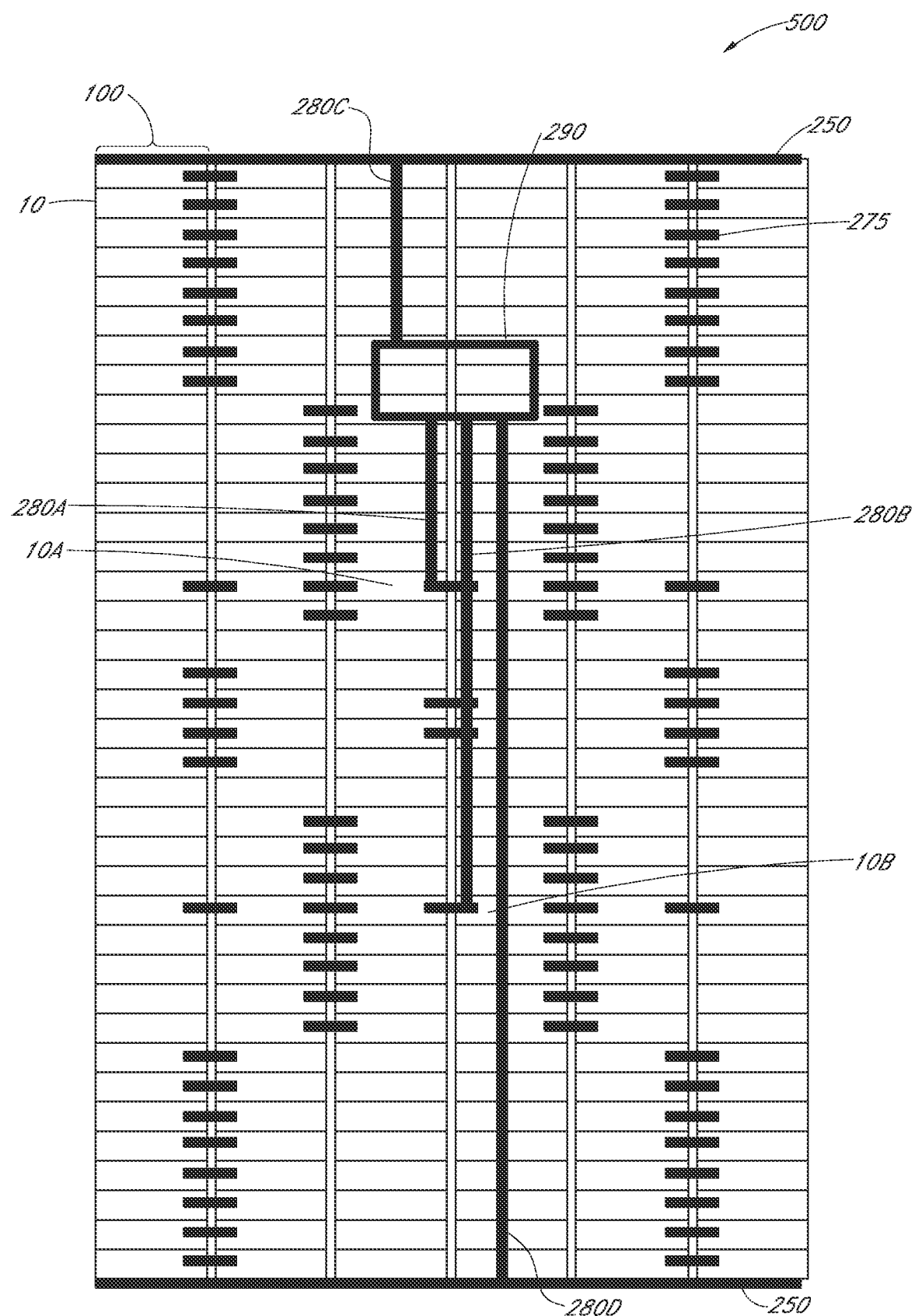
Figure 6:
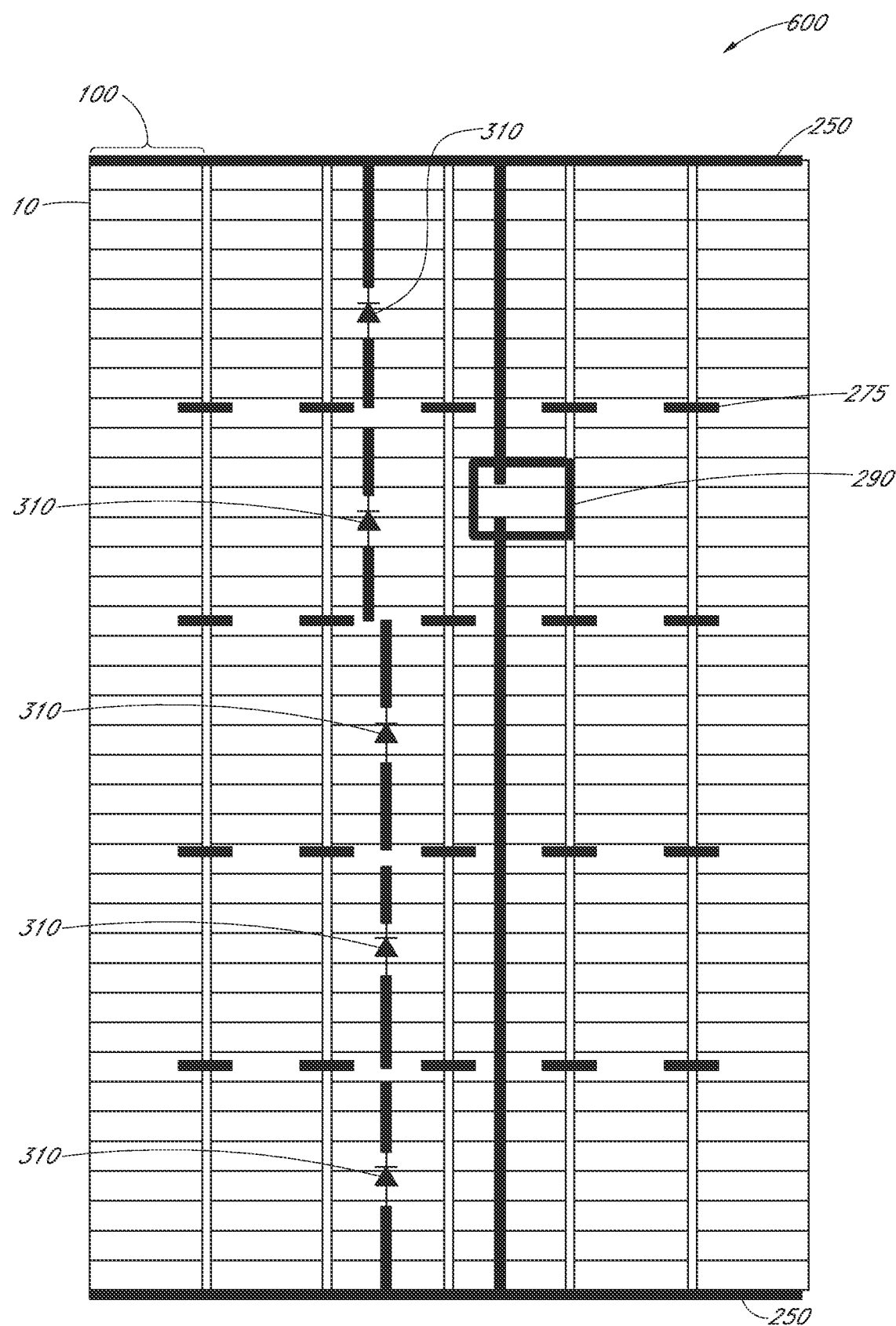
Figure 7:
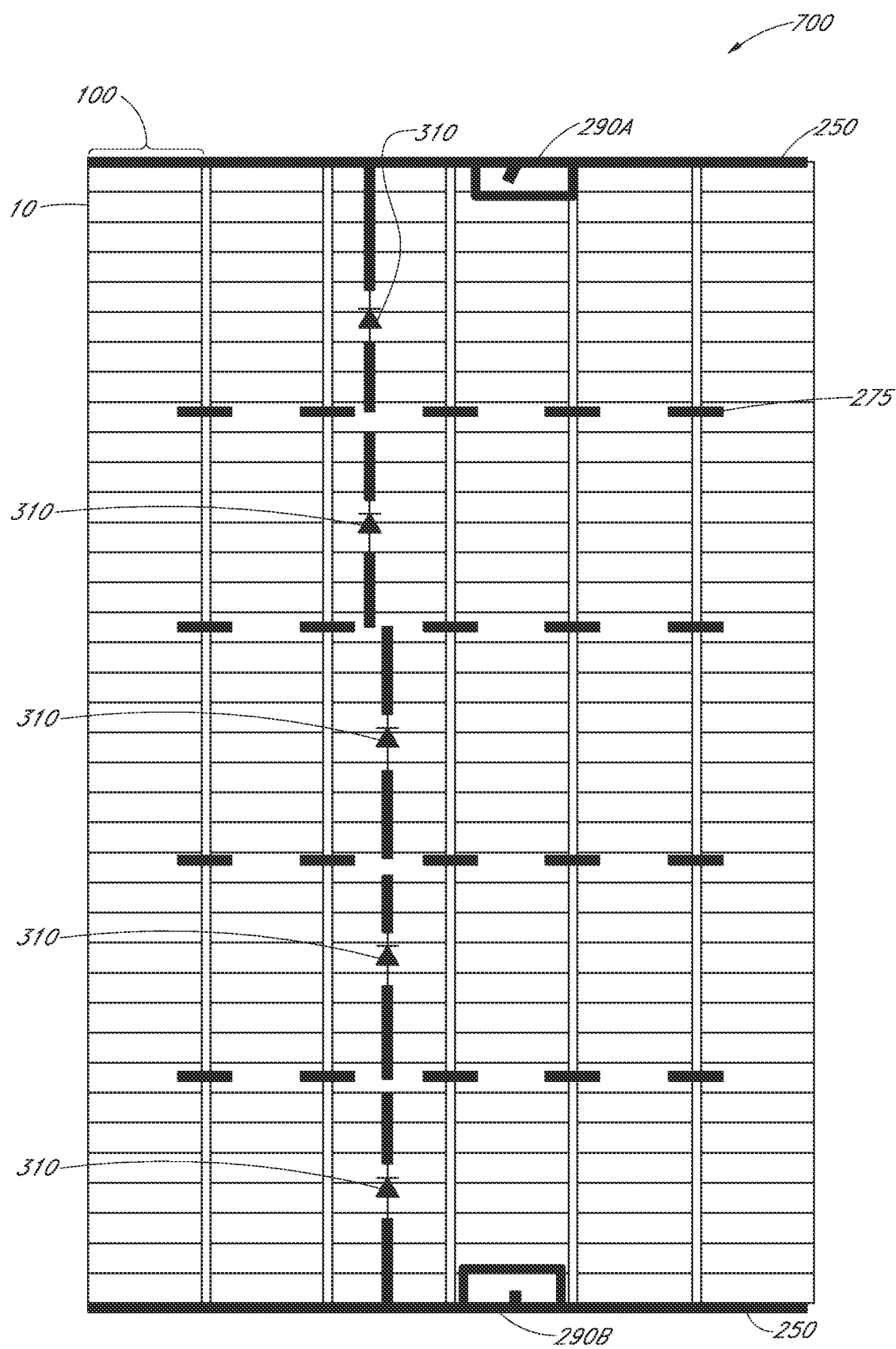
Figure 8:
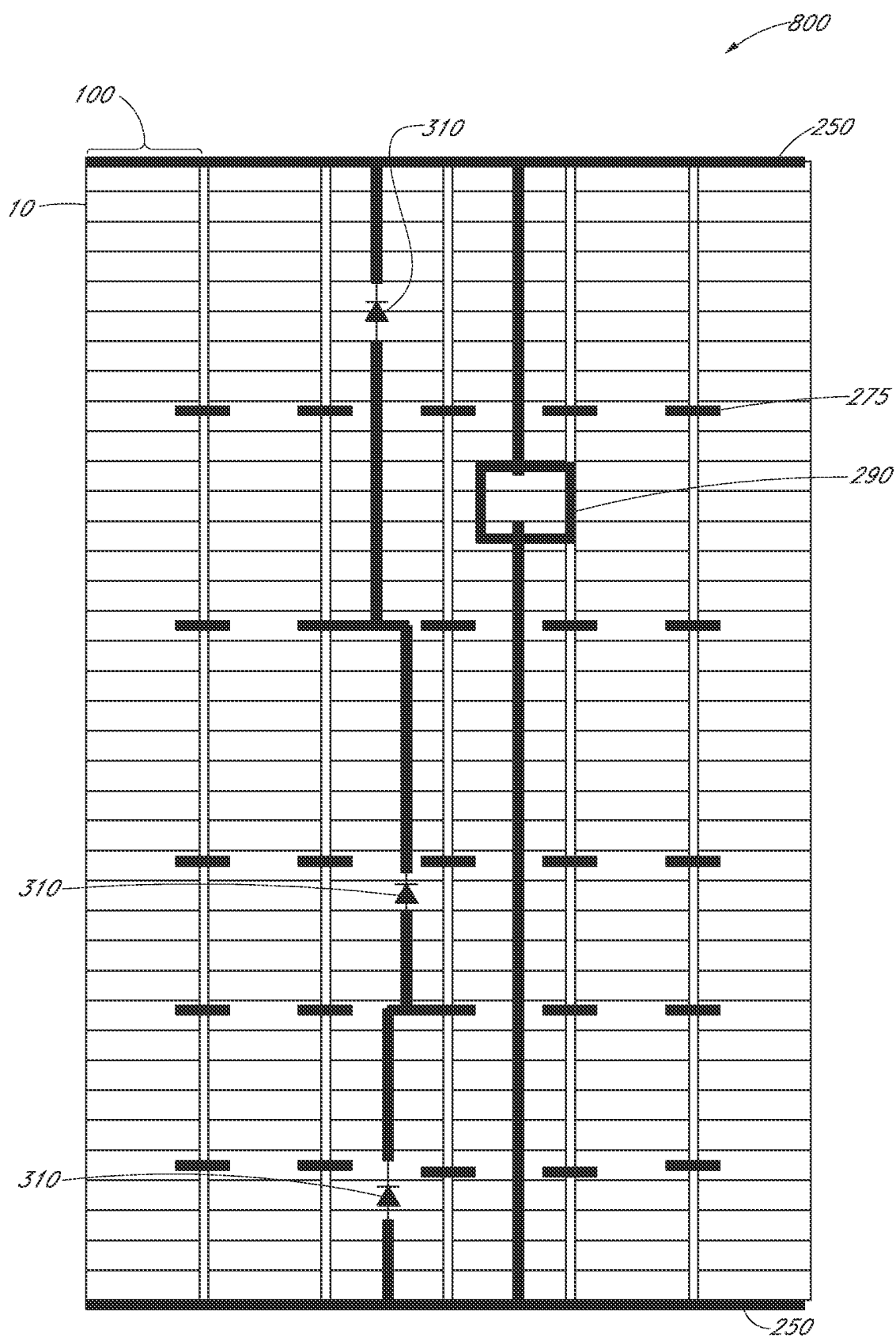
Figure 9:
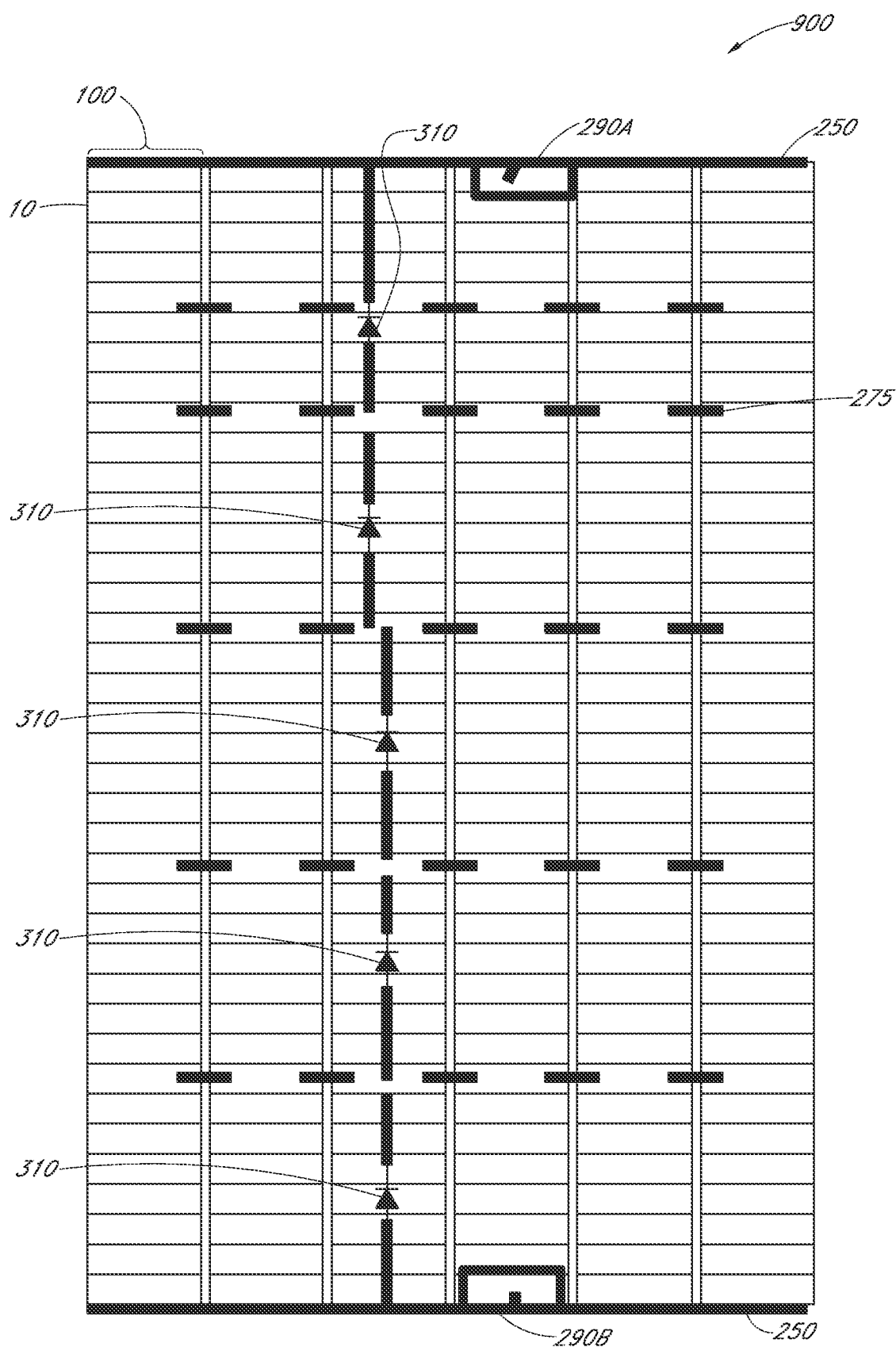
Figure 13:
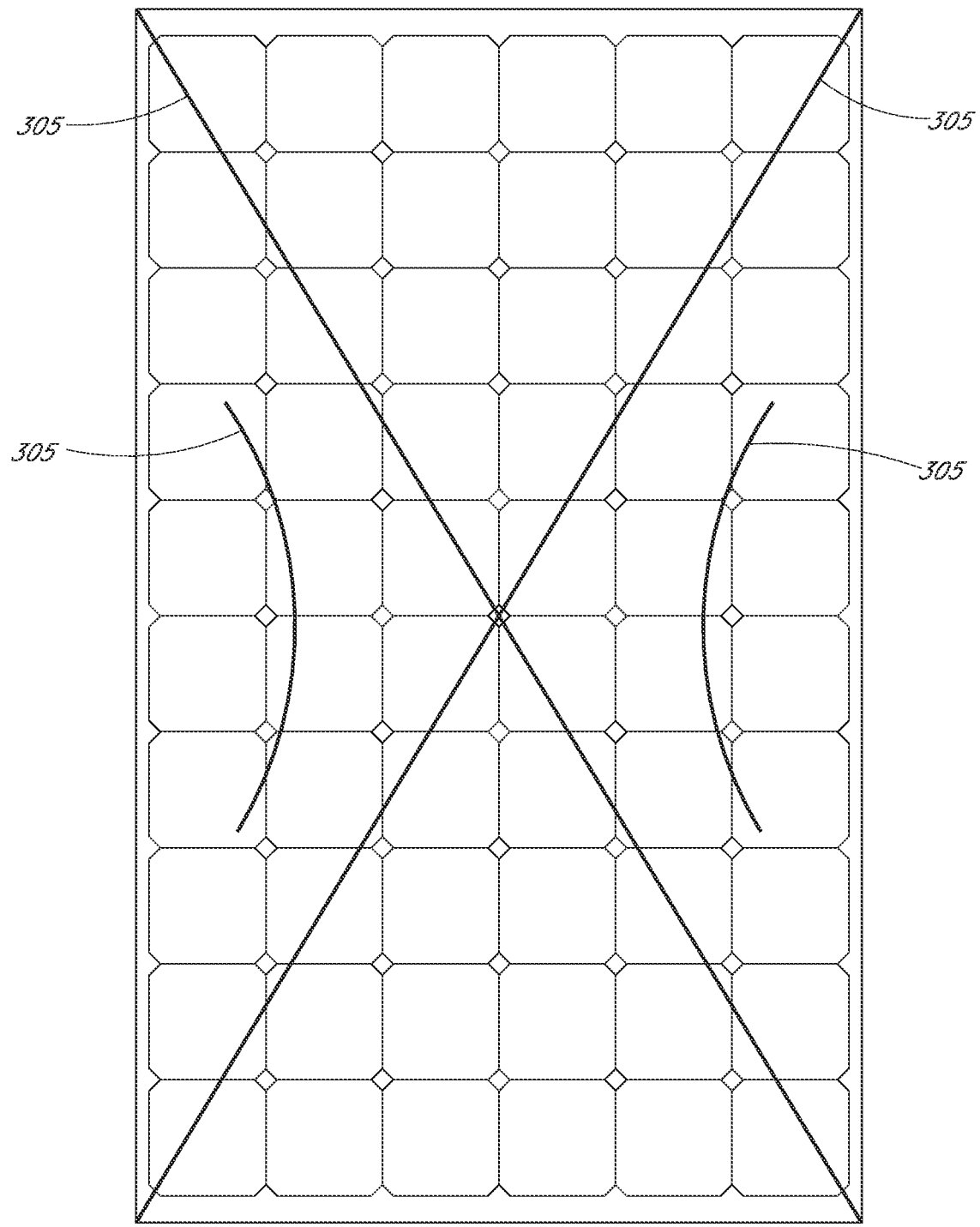
FIG. 13 shows a typical crack pattern in a conventional solar module after uniform mechanical loading.

In example solar module 500 of FIG. 5, detour interconnects 275 are installed in a pattern designed to compensate for a typical crack pattern that may result from uniform mechanical loading of a solar module. The crack pattern is shown in FIG. 13 superimposed on a sketch of a conventional ribbon tabbed solar module, with the crack pattern generally indicated by lines 305. In the example of FIG. 5, conductors 280A and 280B are conductively bonded to the rear surface metallization of solar cells 10A and 10B, respectively, to electrically connect them to bypass diodes in junction box 290

Detour interconnects may be installed at any suitable intervals along a super cell row. The intervals may be equal or approximately equal, or instead vary in length along the row. In example solar modules 600 (FIG. 6) and 700 (FIG. 7), detour interconnects 275 are installed in four approximately evenly spaced lines across the module. In example solar modules 800 (FIG. 8) and 900 (FIG. 9), detour interconnects 275 are installed in five lines across the module, with the interval between detour interconnects greater at one end of the module than at the other end of the module. In example solar module 1000 (FIG. 10), detour interconnects 275 are installed in six lines across the module, with the interval between interconnects greater in the central portion of the module than at the ends of the module. In example solar module 1100 (FIG. 11), detour interconnects 275 are installed in nine lines across the module in combination with five series-connected bypass diodes, with two lines of interconnects between each adjacent pair of bypass diodes.

If the solar module comprises bypass diodes, any suitable number of bypass diodes may be used and they may be spaced along the super cell rows at any suitable interval. The bypass diodes may be installed in a junction box, or alternatively embedded in a laminate comprising the solar cells. Example solar modules 300, 400, 500, and 1000 each include three series-connected bypass diodes (not shown) arranged in junction box 290. In example solar modules 600, 700, 900, and 1100 five series-connected bypass diodes 310 are embedded in the solar cell laminate. In example solar cell module 800 three series-connected bypass diodes 310 are embedded in the laminate. Example solar modules 700 and 900 each include two junction boxes 290A and 290B, one at each end of the module, each providing a single (e.g., positive or negative) output.

Figure 12A:
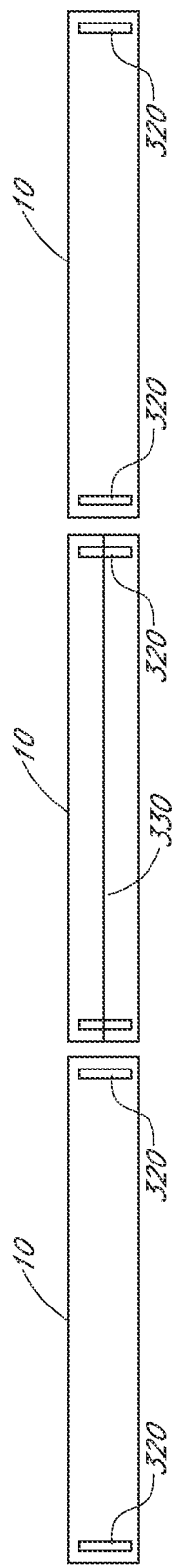
FIGS. 12A-12B show rear surface metallization of individual solar cells and detour electrical connections between super cells allowing current to flow around a horizontal crack in a solar cell.
Figure 12B:
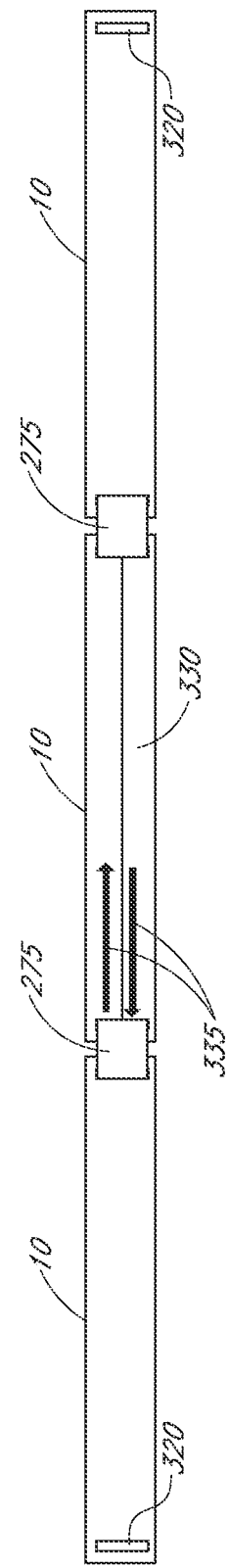

Referring now to FIGS. 12A-12B, a crack (e.g., crack 330) oriented along the long axis of a solar cell 10 can substantially reduce current flow perpendicular to the long axis of the cell, which is the direction in which current generally and preferably flows through the solar cells during normal operation of the modules described herein (i.e., when not taking a detour path). The use of detour electrical interconnects as described above can provide a detour path around the cracked cell.

A detour current path around and over the crack can also be provided within the cell, as shown in FIGS. 12A-12B. In particular, detour interconnect contact pads 320 on the rear surface of the solar cell are positioned at the short ends of the solar cell and elongated parallel to the short ends to substantially span the width of the solar cell. Detour interconnects 275 that are conductively bonded to these contact pads provide a crack jumping current path, allowing current within the cell to make its way to an interconnect 275, go over or around the crack, and then back to the other part of the solar cell as shown for example by arrows 335.

Figure 10:
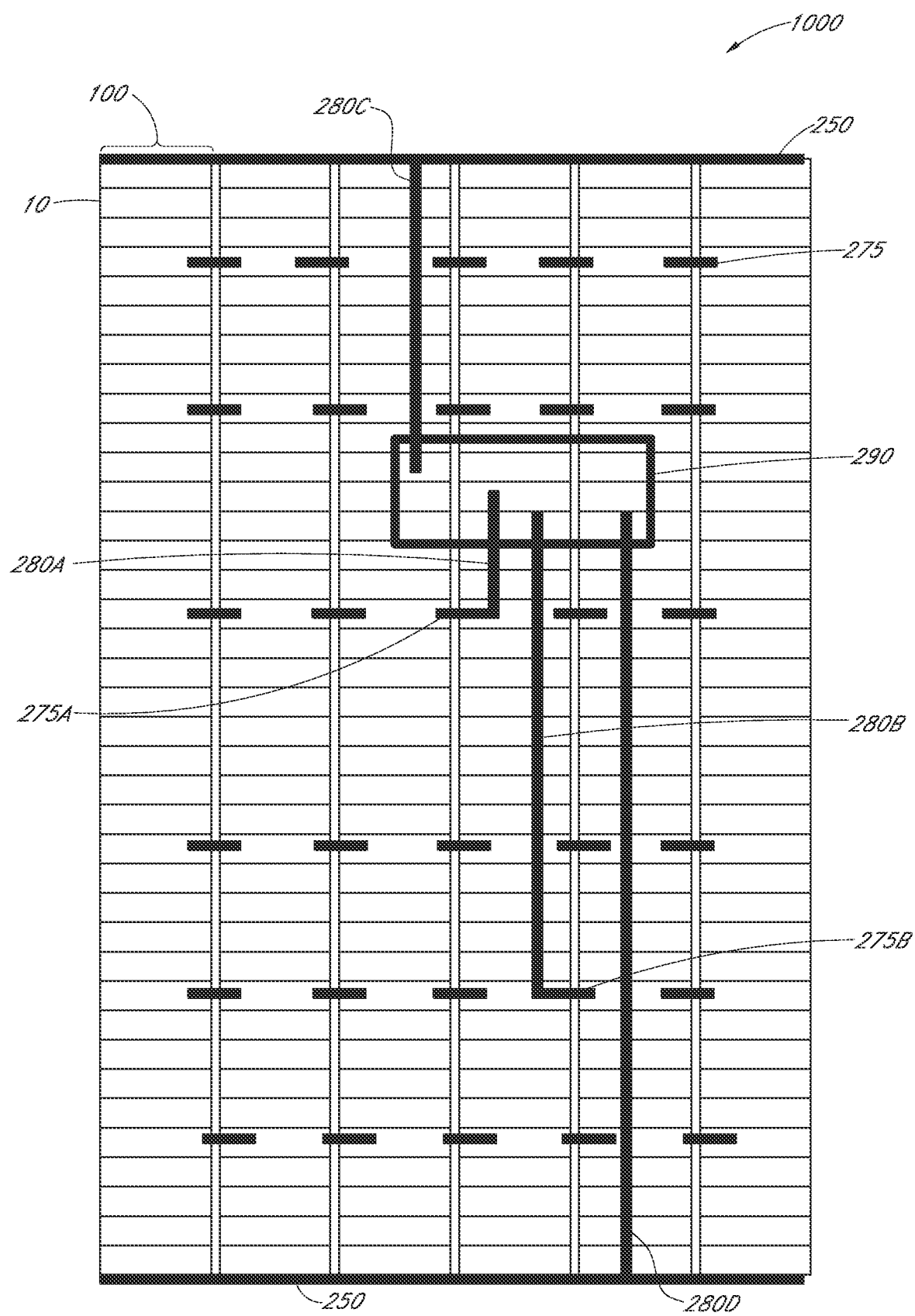
Figure 11:
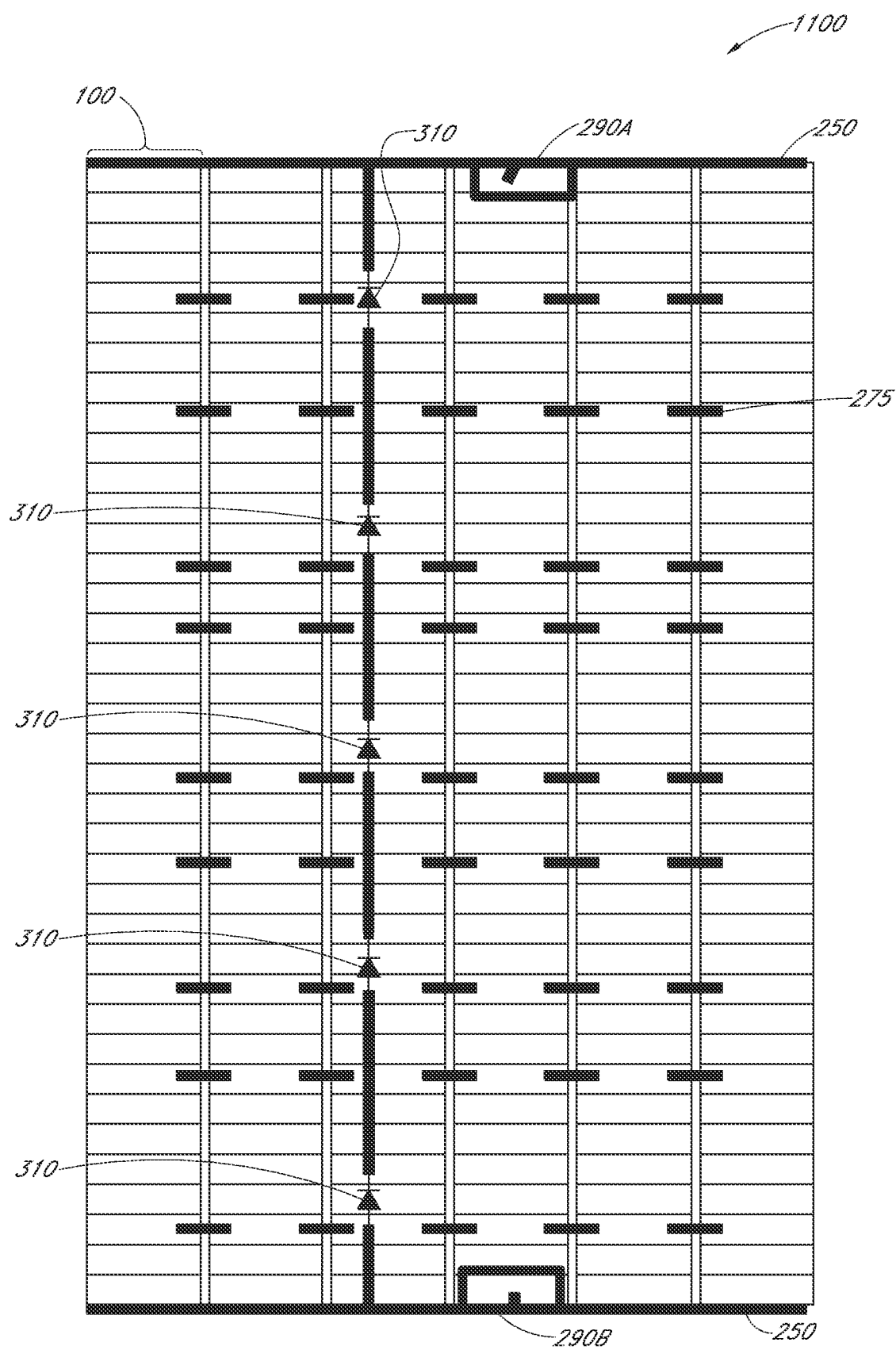
Figure 14A:
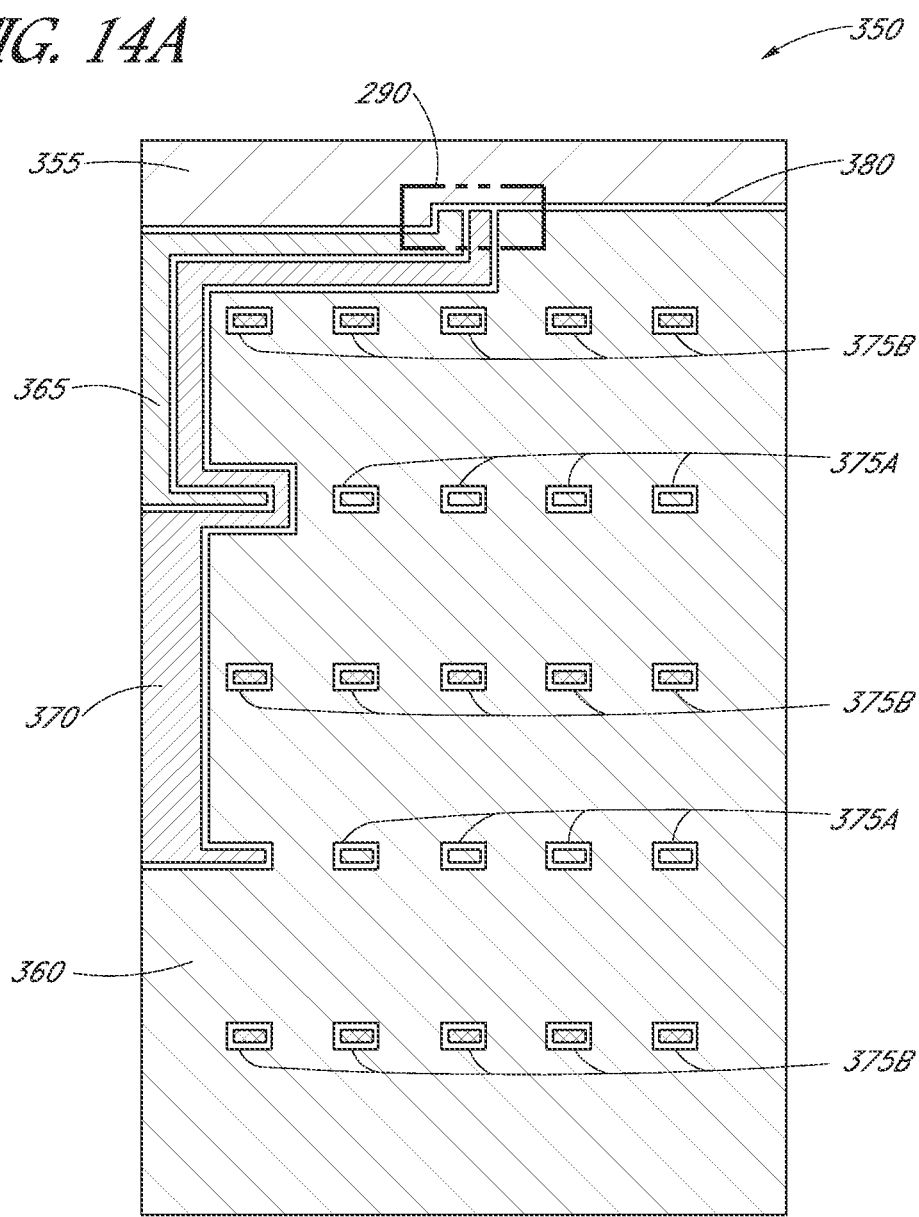
FIG. 14A shows an example patterned metallized back sheet that provides electrical connections corresponding to those provided by the electrical interconnects and return wires shown in FIG. 10.
Figure 14B:
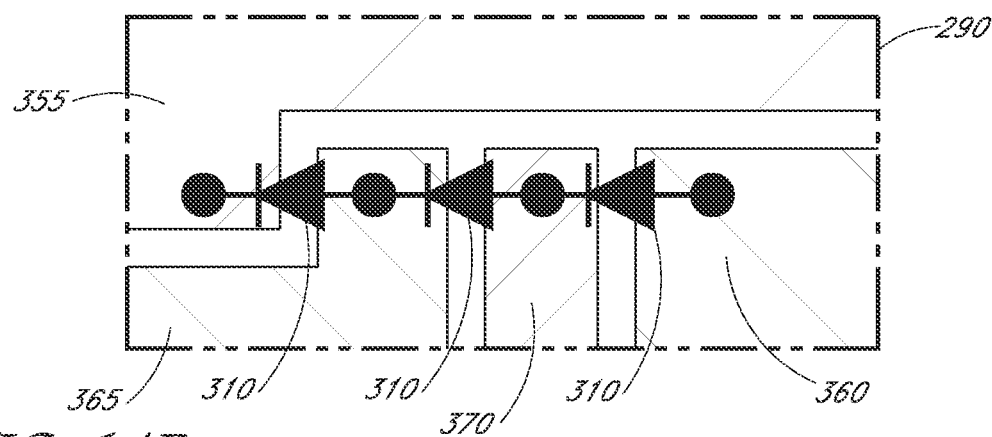
FIG. 14B shows a close-up view of electrical interconnections to bypass diodes in the junction box shown in FIG. 14A.

Referring now to FIGS. 14A-14B, example patterned metallized back sheet 350 provides detour current paths and electrical connections to bypass diodes 310 in a junction box 290 corresponding to those provided by detour interconnects 275 and return wires 280A-280D shown in FIG. 10. (The junction box is not part of the back sheet, but is located in the module with respect to the back sheet as shown in the figures). In particular, the metallization pattern comprises a positive return region 355, a negative return region 360, a first bypass diode return path 365, a second bypass diode return path 370, two rows of detour interconnect regions 375A that also serve as hidden taps to the bypass diodes, and three additional rows of detour interconnect regions 375B. Metallization is removed from the sheet, for example as indicated at 380, to electrically isolate the various regions from each other.

Although in the example solar modules described above each rectangular solar cell 10 has long sides having a length equal to the side length of a conventional silicon solar cell wafer, alternatively the long sides of solar cells 10 can be a fraction (e.g., ½, ⅓, ¼, or less) of the side length of a conventional solar cell wafer. The number of rows of super cells in a module can be correspondingly increased, for example by the reciprocal of that fraction (or by one or more rows less than the reciprocal to leave room for gaps between rows). For example, each full length solar cell 10 in solar module 300 (FIG. 3) could be replaced by two solar cells of ½ length arranged in eleven or twelve rows of super cells, or in any other suitable number of rows of super cells. The rectangular solar cells could have dimensions of ⅙ by ½ the side length of a conventional solar cell wafer, for example. Reducing cell length in this manner may increase the robustness of the cells with respect to cracking, and reduce the impact of a cracked cell on performance of the module.

Further, the use of detour electrical interconnects or metallized backing sheets as described above with smaller cells as just described can increase the number of detour current paths available through the module (compared to the use of full length cells), further reducing the impact of a cracked cell on performance.

This disclosure is illustrative and not limiting. Further modifications will be apparent to one skilled in the art in light of this disclosure and are intended to fall within the scope of the appended claims.

What is claimed is:

1. A solar module comprising:
   a first, second, and third super cell arranged in physically parallel rows, each super cell comprising a plurality of crystalline silicon solar cells, each crystalline silicon solar cell having a front surface metallization pattern on a front surface and a rear surface metallization pattern on a rear surface to provide electrical contact to opposite sides of the crystalline silicon solar cell;
   wherein the plurality of crystalline silicon solar cells in each super cell are arranged in an overlapping shingled manner and conductively bonded to each other in a region in which they overlap to electrically connect the crystalline silicon solar cells in series;
   a first and second terminal electrical interconnect located at a first and second end of the solar module, respectively, and electrically connecting the first, second, and third super cells in parallel;
   a first detour electrical interconnect arranged to extend along a first line perpendicular to the first, second, and third super cells arranged in physically parallel rows, the first detour electrical interconnect electrically connecting the rear surface metallization patterns on the rear surfaces of crystalline silicon solar cells in the first, second, and third super cells located along the first line;
   a second detour electrical interconnect arranged to extend along a second line perpendicular to the first, second, and third super cells arranged in physically parallel rows, the second detour electrical interconnect electrically connecting the rear surface metallization patterns on the rear surfaces of crystalline silicon solar cells in the first, second, and third super cells located along the second line;
   a junction box containing a bypass diode;
   a first return conductor electrically connecting the first detour electrical interconnect to the bypass diode in the junction box; and
   a second return conductor electrically connecting the second detour electrical interconnect to the bypass diode in the junction box, the second return conductor crossing the first line, the second return conductor separate from the first return conductor.

2. The solar module of claim 1, wherein the first and second detour electrical interconnects are spaced apart from each other at equal intervals along the solar module.

3. The solar module of claim 1, wherein the junction box provides a single positive or negative output for the solar module.

4. The solar module of claim 1 comprising a second bypass diode, wherein the junction box contains the second bypass diode.

5. The solar module of claim 4, comprising a third return conductor, the third return conductor electrically connecting the first terminal electrical interconnect to the second bypass diode in the junction box.

6. The solar module of claim 5, wherein the first return conductor is electrically connected to the second bypass diode.

7. The solar module of claim 1, wherein each detour electrical interconnect is or comprises a conductive ribbon electrically connected to the rear surface metallization pattern on the rear surface of a crystalline silicon solar cell in each row.

8. The solar module of claim 1, wherein the rear surface metallization pattern of each crystalline silicon solar cell comprises a rear detour interconnect contact pad on the rear surface of the crystalline silicon solar cell.

9. The solar module of claim 8, wherein the rear detour interconnect contact pad is elongated in a direction parallel to a short side of the crystalline silicon solar cell.

10. The solar module of claim 1, wherein the bypass diode is connected in parallel to 22 or more crystalline silicon solar cells in the first super cell.

11. The solar module of claim 1, wherein the bypass diode is connected in parallel to 26 or more crystalline silicon solar cells in the first super cell.

12. The solar module of claim 1, wherein the first, second, and third super cells each contain 80 or more crystalline silicon solar cells arranged in an overlapping shingled manner and conductively bonded to each other.

13. The solar module of claim 1, wherein the solar module contains only three bypass diodes.

14. The solar module of claim 12, wherein the solar module contains only three bypass diodes.

15. The solar module of claim 6, wherein the bypass diode is connected in parallel to 22 or more crystalline silicon solar cells in the first super cell.

16. The solar module of claim 15, wherein the junction box provides a single positive or negative output for the solar module.

17. The solar module of claim 16, wherein the first, second, and third super cells each contain 80 or more crystalline silicon solar cells arranged in an overlapping shingled manner and conductively bonded to each other.

18. The solar module of claim 17, wherein the solar module contains only three bypass diodes.

* * * * *